United States Patent
Rusconi Clerici Beltrami et al.

(10) Patent No.: US 11,565,935 B2
(45) Date of Patent: Jan. 31, 2023

(54) MANUFACTURING PROCESS FOR AT LEAST ONE DIAPHRAGM UNIT OF A MEMS TRANSDUCER

(71) Applicant: USOUND GMBH, Graz (AT)

(72) Inventors: Andrea Rusconi Clerici Beltrami, Vienna (AT); Ferruccio Bottoni, Graz (AT); Nick Renaud-Bezot, Vienna (AT)

(73) Assignee: USound GmbH, Graz (AT)

( * ) Notice: Subject to any disclaimer, the term of this patent is extended or adjusted under 35 U.S.C. 154(b) by 475 days.

(21) Appl. No.: 16/677,171

(22) Filed: Nov. 7, 2019

(65) Prior Publication Data
US 2020/0148533 A1 May 14, 2020

(30) Foreign Application Priority Data

Nov. 8, 2018 (EP) ..................................... 18306463

(51) Int. Cl.
*B81C 1/00* (2006.01)
*B81B 3/00* (2006.01)

(52) U.S. Cl.
CPC ........ *B81C 1/00158* (2013.01); *B81B 3/0021* (2013.01); *B81B 2201/0257* (2013.01); *B81B 2201/036* (2013.01); *B81B 2203/0127* (2013.01); *B81C 2201/013* (2013.01); *B81C 2201/0194* (2013.01)

(58) Field of Classification Search
CPC ........ B81C 1/00158; B81B 2203/0127; B81B 3/0021; B81B 2201/0257; H04R 31/00; H04R 31/006
See application file for complete search history.

(56) References Cited

U.S. PATENT DOCUMENTS

| | | | |
|---|---|---|---|
| 7,151,057 B2 | 12/2006 | Nam | |
| 8,413,317 B1 | 4/2013 | Wan et al. | |
| 10,412,505 B2 | 9/2019 | Rusconi Clerici Beltrami | |
| 2004/0164650 A1* | 8/2004 | Xu | ........................ H01L 41/314 |
| | | | 310/328 |
| 2010/0033201 A1 | 2/2010 | Hsu | |
| 2011/0284657 A1* | 11/2011 | Andrews | ................ B41J 2/1623 |
| | | | 29/25.35 |

(Continued)

OTHER PUBLICATIONS

Foreign Office Action with the English translation for CN application No. 201911014663.8, dated Sep. 8, 2022.

*Primary Examiner* — Monica D Harrison
*Assistant Examiner* — Lawrence C Tynes, Jr.
(74) *Attorney, Agent, or Firm* — Dority & Manning, P.A.

(57) ABSTRACT

A process for manufacturing a diaphragm unit of a MEMS transducer that includes multiple piezoelectric transducer units, each of the multiple piezoelectric transducer units including at least one electrode layer and at least one piezoelectric layer formed on a carrier includes the step of removing the transducer units from the carrier. At least one of the transducer units that has been removed from the carrier is arranged on a diaphragm and connected to the diaphragm. Moreover, a diaphragm unit made according to the process includes a diaphragm and multiple piezoelectric transducer units arranged on and connected to the diaphragm. Each of the multiple piezoelectric transducer units includes at least one electrode layer and at least one piezoelectric layer formed on a carrier.

19 Claims, 9 Drawing Sheets

(56) References Cited

U.S. PATENT DOCUMENTS

| | | | |
|---|---|---|---|
| 2012/0049298 A1 | 3/2012 | Schlarmann | |
| 2013/0323085 A1* | 12/2013 | Hirata | F04B 43/046 |
| | | | 417/413.1 |
| 2014/0292930 A1* | 10/2014 | Zuo | B41J 2/1623 |
| | | | 347/44 |
| 2017/0221830 A1* | 8/2017 | Scanlan | H01L 21/76838 |
| 2018/0278228 A1* | 9/2018 | Hurwitz | H01L 41/107 |
| 2018/0314871 A1* | 11/2018 | He | H01L 41/1132 |

* cited by examiner

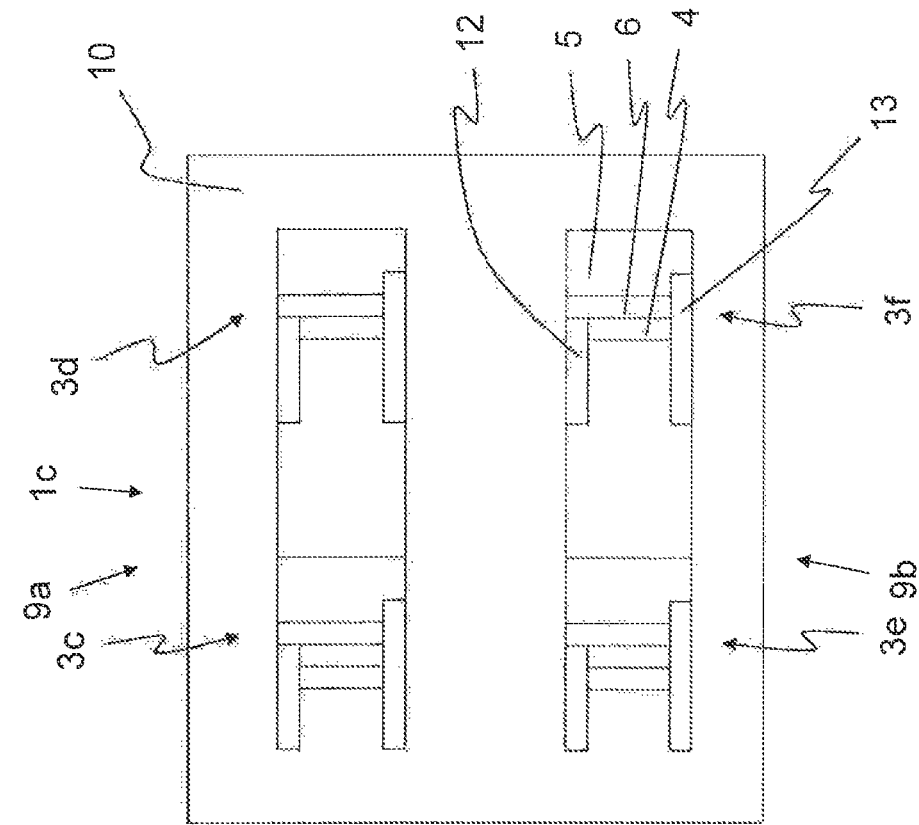
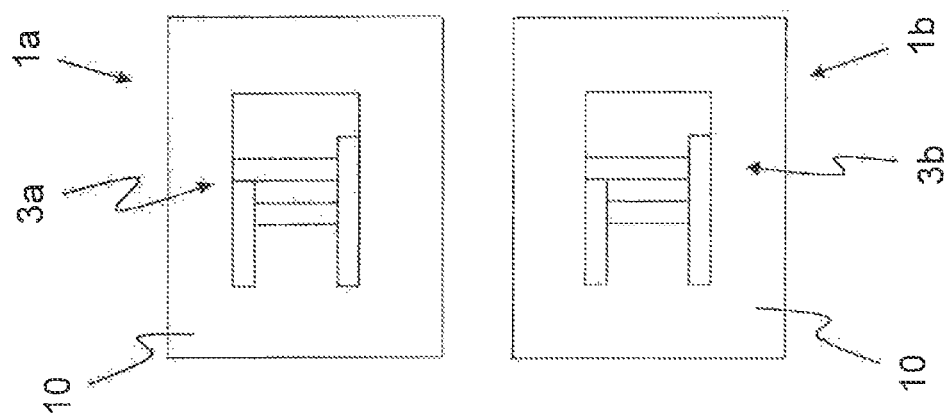
Fig. 7

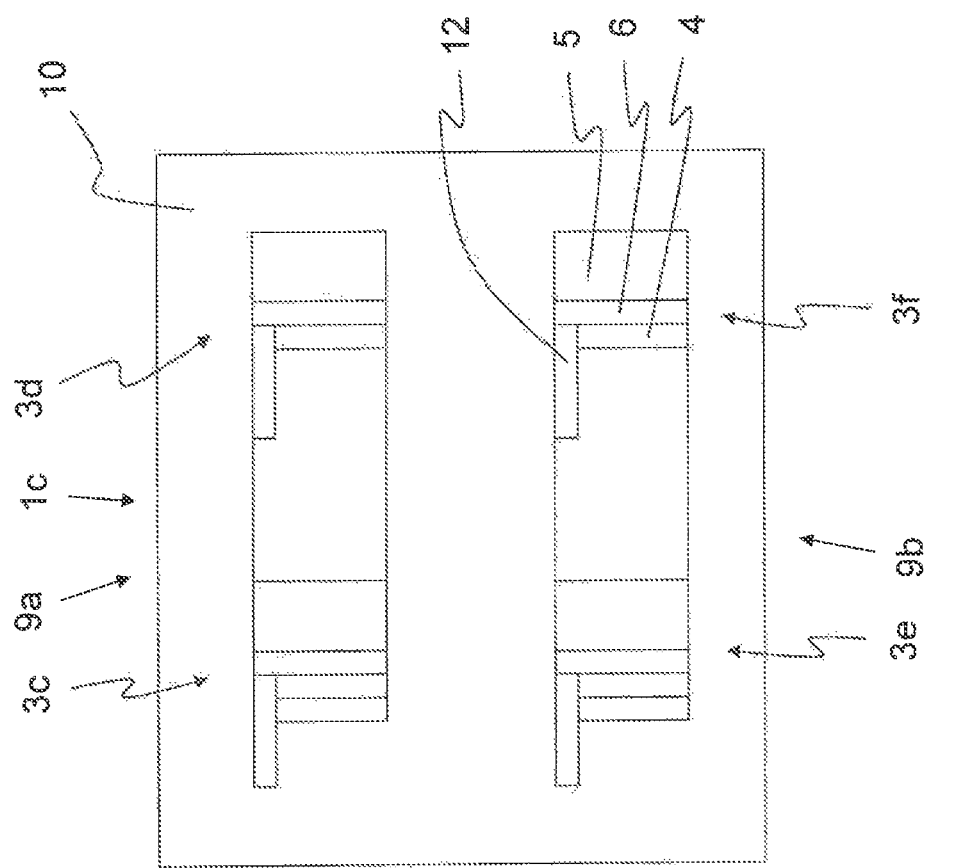
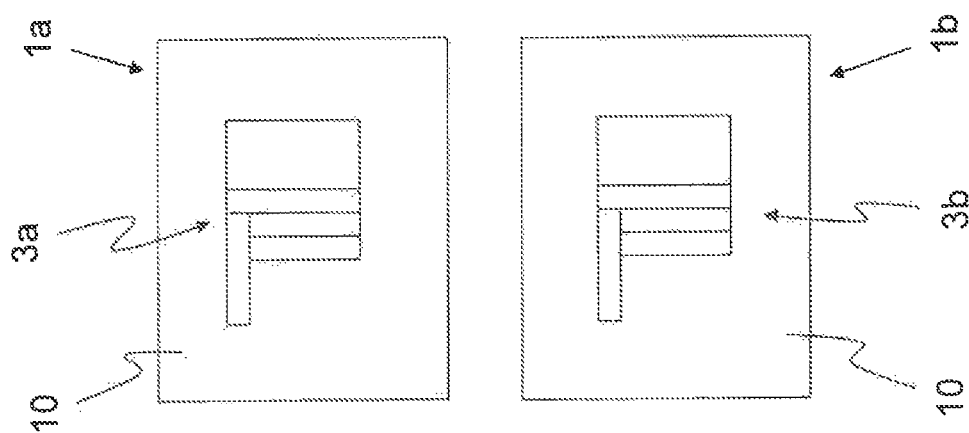
Fig. 9

MANUFACTURING PROCESS FOR AT LEAST ONE DIAPHRAGM UNIT OF A MEMS TRANSDUCER

CROSS REFERENCE TO RELATED APPLICATIONS

Not applicable

FIELD OF THE INVENTION

The present invention relates to a manufacturing process for at least one diaphragm unit of a MEMS transducer, in which multiple piezoelectric transducer units, each having at least one electrode layer and at least one piezoelectric layer, are formed on a carrier.

BACKGROUND OF THE INVENTION

U.S. Pat. No. 7,151,057 B2, which is hereby incorporated herein by this reference for all purposes, describes a process for manufacturing a MEMS transducer. This process includes applying a sacrificial layer onto a substrate. Thereafter, a diaphragm layer, a lower electrode layer, an active layer, and an upper electrode layer are consecutively applied. The disadvantage thereof is that a flexibility of the manufacturing process is limited.

OBJECTS AND SUMMARY OF THE INVENTION

The object of the present invention is therefore to be able to more flexibly configure a manufacturing process of a diaphragm unit of a MEMS transducer and devices in accordance therewith.

The object is achieved by means of a manufacturing process and resulting devices having the features described hereinafter.

The invention relates to a process for manufacturing at least one diaphragm unit of a MEMS transducer. MEMS is an abbreviation and stands for "micro-electromechanical systems". With the aid of the MEMS transducer, electrical signals can be converted into movements, and movements can be converted into electrical signals. In this way, the MEMS transducer can be utilized for generating and/or detecting sound waves. The MEMS transducer can therefore be utilized as a loudspeaker and/or as a microphone. The MEMS transducer converts an electrical signal, which embodies information characteristic of an audio signal, into sound. The MEMS transducer also can detect the sound, which can be vibrations transmitted through the air as an audio signal, and convert these vibrations into an electrical signal, which, in turn, embodies an audio signal. The MEMS transducer converts the electrical signal into a deflection, which can be transmitted onto a diaphragm of the diaphragm unit. The deflection generates a pressure onto a surrounding medium, in particular air, and excites the air to vibrate, whereby the sound is generated. However, if a pressure fluctuation, for example, in the form of sound, impacts the diaphragm, the diaphragm is deflected and transmits the deflection onto the transducer unit, which converts the deflection into an electrical signal. As a result, the sound can be detected. Moreover, the MEMS transducer can be utilized for detecting and/or generating sound in the audible wavelength spectrum. The MEMS transducer can be utilized, for example, in a smartphone, a computer, an MP3 player, or any other types of devices for the playback of music or for recording sound. Additionally or alternatively, sound in the ultrasonic range can also be generated and/or detected with the aid of the MEMS transducer. The MEMS transducer can therefore be utilized, for example, for technical test instruments, for a proximity sensor, or a distance sensor or for measuring distances. Additionally or alternatively, the MEMS transducer can also be utilized for pump arrangements, in order to apply a pressure to a medium, in particular a fluid such as a liquid or gas. The MEMS transducer can be utilized, for example, in a micropump or in micromechanics.

The diaphragm unit can be arranged, for example, on a circuit board, in order to form the MEMS transducer. For example, the diaphragm unit can be arranged over an opening and/or a hole in the circuit board, so that the diaphragm unit can freely vibrate. As a result, the MEMS transducer is formed, which can generate and/or detect the sound. The diaphragm unit can be stretched over the opening and/or the hole. Additionally or alternatively, the diaphragm unit can also be placed, in particular clamped, into a housing, in order, for example, to form an in-ear earphone, for example, a hearing aid.

During the manufacturing process, multiple piezoelectric transducer units, each comprising at least one electrode layer and at least one piezoelectric layer, are formed on a carrier. The piezoelectric layer is made of a piezoelectric material. The piezoelectric layer deflects when it is acted upon by an electrical signal. By comparison, the piezoelectric layer generates an electrical signal when it is deflected itself.

The carrier can be, for example, a silicon wafer, a glass pane, a metal, a metal foil, and/or an epitaxial wafer. The carrier acts as a framework, on which the transducer units can be assembled. The carrier can have, for example, a thickness of at least 500 µm. In particular, the carrier is a few millimeters thick. As a result, the carrier can stand up to being handled.

With the aid of the at least one electrode layer, the electrical signal can be conducted to the piezoelectric layer and can be conducted away from the piezoelectric layer. Advantageously, an electrical connection is formed between the at least one electrode layer and the piezoelectric layer.

The transducer unit comprises, at least, the at least one electrode layer and the at least one piezoelectric layer.

According to the invention, the carrier is removed from the transducer units. As a result, the transducer units are at least partially separated from one another, so that they can be stored for the interim and, as needed, further processed. A plurality of transducer units can be formed, wherein the manner in which the diaphragm unit is to be subsequently designed does not yet need to be determined. The manufacture of the transducer units is essentially independent of the manufacture of the diaphragm units. The manufacture of the transducer units can be standardized. As a result, and due to the manufacture of a large number of transducer units, which can have great similarity to one another, a high level of flexibility is ensured for the manufacture of the diaphragm unit and, therefore, of the MEMS transducer. In the next manufacturing step, the transducer units can be arranged nearly arbitrarily on a diaphragm, so that a broad spectrum of different shapes and configurations of the diaphragm units and, therefore, of the MEMS transducers is made possible.

Moreover, at least one of the transducer units is arranged on the diaphragm and is connected thereto, in order to form the at least one diaphragm unit. The manufacturing process therefore includes the steps that, first of all, the transducer units are manufactured and are then placed onto the diaphragm, which can already be present, and are connected thereto. As a result, the transducer units can be manufactured in large quantities, without the need, for example, to plan what the diaphragm unit will eventually look like. Furthermore, the transducer units can be tested with respect to their functional capability and faulty transducer units can be removed from production. Moreover, a design of the diaphragm unit can be newly established or changed during the manufacturing process. The transducer units can also be placed on the diaphragm in any shape, arrangement, configuration, and/or geometry. Furthermore, if so desired, multiple transducer units can also form a diaphragm unit. The transducer units can be grouped on the diaphragm, for example, during placement, in order to form the diaphragm unit.

It is advantageous when the transducer units are formed on the carrier in such a way that they are separated from one another. As a result, the further processing is simplified, since the individual transducer units are already separated, for example, when the carrier is removed from the transducer units. The transducer units no longer need to be separated from one another.

Additionally or alternatively, the transducer units can be separated from one another before or after the carrier is removed. If the transducer units are separated from one another when they are still arranged on the carrier, the carrier comprising the transducer units can be more easily handled. By comparison, if the transducer units are separated after the carrier is removed, the transducer units can be separated in a flexible manner and, for example, only when they are needed. Additionally or alternatively, only as many transducer units can be separated as are needed.

It is advantageous when the transducer units are designed separated from one another and/or are separated from one another in such a way that at least one isolated transducer unit is formed. As a result, individual transducer units are obtained, which can be arranged on the diaphragm in a special geometry or arrangement, for example, according to a requirement. Additionally or alternatively, the transducer units can also be designed separated from one another and/or can be separated from one another in such a way that at least one contiguous group of at least two transducer units is formed. As a result, the arrangement of the transducer units on the diaphragm can be simplified if the diaphragm unit is to comprise at least two transducer units, for example, according to a requirement or because this is useful for an application.

It is advantageous when a carrier layer is formed on the carrier, on which the at least one electrode layer and the at least one piezoelectric layer of the transducer units are formed. With the aid of the carrier layer, for example, unevenness of the carrier can be compensated for, so that a defined surface for the at least one electrode layer and the at least one piezoelectric layer is provided. The carrier layer can also be utilized, however, for removing the carrier from the transducer units. It can be advantageous, for example, to reuse the carrier. The carrier can be designed, for example, as a silicon wafer, which is expensive to acquire, and therefore it can be meaningful to reuse it. The removal of the carrier from the transducer units can be simplified with the aid of the carrier layer. The carrier layer can be, for example, partially removed, so that the carrier is removable from the transducer units. The carrier layer can be designed, for example, as an epitaxial layer on the carrier.

Additionally or alternatively, the carrier layer can also form a part of the transducer units. The carrier layer can have, for example, a rigidity, which is greater than that of the piezoelectric layer, so that the piezoelectric layer can deflect with respect to the carrier layer. The carrier layer can therefore form a fixing element for the transducer units. The carrier layer can therefore act as an anchor point or a retaining layer.

Additionally or alternatively, the at least one electrode layer, the at least one piezoelectric layer, and/or the carrier layer can be formed one above the other on the carrier. As a result, the transducer units are formed in layers and extend away from the carrier.

Advantageously, a first and a second electrode layer are formed on the carrier. With the aid of the two electrode layers, a circuit can be formed with the piezoelectric layer. One of the two electrode layers can act as ground or reference potential in this case.

Additionally or alternatively, it is advantageous when the piezoelectric layer is formed between the first electrode layer and the second electrode layer. As a result, the piezoelectric layer is contacted from above and from below with the aid of the two electrode layers.

It is advantageous when the first electrode layer is formed first of all, then the piezoelectric layer, and then the second electrode layer. As a result, the transducer units can be formed layer by layer, wherein the piezoelectric layer is formed between the two electrode layers. Additionally or alternatively, the carrier layer can be formed in advance. As a result, the carrier layer is the lowermost layer.

Advantageously, the transducer units are formed layer by layer with the aid of a, in particular selective, deposition process and/or a coating process. The processes are typical in the manufacture of microelectronic components. The deposition process can be, for example, a gas phase deposition process. Essentially any process can be utilized, with the aid of which the particular layers of the transducer units can be formed. The layers of the transducer units can have thicknesses of a few micrometers in this case. Such processes are utilized, for example, in semiconductor technology.

It is advantageous when the carrier layer, the at least one electrode layer, and/or the piezoelectric layer are/is formed over the entire surface of the carrier. As a result, the manufacturing process is simplified, since the appropriate layers are arranged over the entire carrier.

Additionally or alternatively, it is advantageous when the carrier layer, the at least one electrode layer, and/or the piezoelectric layer are/is at least partially removed between the transducer units, so that the transducer units are at least partially separated from one another. As a result, the transducer units can be separated from one another. For example, only the carrier layer can remain, so that the transducer units remain connected to the carrier layer. Additionally or alternatively, at least one electrode layer can also remain between two adjacent transducer units if the two transducer units form a contiguous group. The remaining electrode layer can then act as a common electrode, for example, as ground, for the two transducer units.

It is advantageous when only the piezoelectric layer and at least one electrode layer are removed, at least between some transducer units, during the separation of the transducer units, so that at least the carrier layer remains intact between these transducer units, so that these form a contiguous group. As a result, the carrier layer connects the group made up of transducer units and fixes these with respect to one another. Additionally or alternatively, an electrode layer of the group made up of transducer units can also remain intact, so that this can form, for example, the ground, i.e., the electrode for the reference potential, for the group made up of transducer units.

It is advantageous when the at least one electrode layer, the at least one piezoelectric layer, and/or the carrier layer are/is selectively formed on the carrier, so that transducer units at least partially separated from one another are formed. This can be carried out, for example, with the aid of a photolithographic process of the type applied in semiconductor or thin-film technology. A mask, for example, can be utilized, with the aid of which a pattern is formed on the carrier. The layers are then formed on the pattern.

It is advantageous when the at least one electrode layer, the piezoelectric layer, and/or the carrier layer are/is removed with the aid of etching and/or cutting. As a result, the transducer units can be separated from one another in a targeted manner.

It is advantageous when a connection between the carrier and the carrier layer is disconnected in order to remove the carrier from the transducer units. This can be carried out, for example, mechanically. Additionally or alternatively, the carrier layer can also be chemically separated from the carrier. As a result, the connection between the carrier and the carrier layer can be released or at least weakened, so that the transducer units can be separated. This has the advantage that the carrier remains intact. The carrier can be designed, for example, as a silicon wafer, which is expensive, and therefore, due to the disconnection of the connection between the carrier and the carrier layer, the carrier can be reused.

Additionally or alternatively, the carrier can be ground off and/or dissolved. This can be an option when the carrier is inexpensive.

Additionally or alternatively, the carrier layer can also be dissolved, for example, chemically, so that the connection between the carrier and the transducer units is disconnected.

It is advantageous when the at least one transducer unit is arranged on a partially cured diaphragm. This can be a B-stage diaphragm. The diaphragm itself is still capable of adhering in this case. Additionally or alternatively, the diaphragm can be subsequently completely cured, so that the transducer unit connects to the diaphragm in an integrally joined manner. The curing can be assisted in this case by supplying heat. As a result, the transducer units can be connected to the diaphragm in an easy way.

It is advantageous when the diaphragm is formed from a polymer. For example, silicone, poly(p-xylylene), and/or Parylene, which have high flexibility, can be utilized as polymers. Additionally or alternatively, the diaphragm can be reinforced with the aid of a reinforcing agent, for example, silsesquioxanes. With the aid of the reinforcing agents, for example, the temperature resistance of the diaphragm can be increased, so that the diaphragm unit can be soldered, for example, without being damaged.

It is advantageous when the diaphragm is formed on a diaphragm carrier. The diaphragm can be deposited on the diaphragm carrier. This can be advantageous in order to provide a diaphragm according to demand.

Additionally or alternatively, the diaphragm can also be made available on a roll. As a result, the diaphragm is available in an essentially unlimited manner. The diaphragm can be unrolled from the roll as needed.

It is advantageous when the transducer units are stored for the interim after the carrier has been removed. The transducer units can be picked up, for example, with the aid of a robot, and set down on a storage element and, as a result, stored for the interim. With the aid of the storage element, the transducer units can be transported to a further-processing location or intermediately stored for processing at a later time.

It is advantageous when multiple diaphragm units are formed with the aid of the diaphragm. As a result, manufacturing costs can be lowered. Multiple transducer units can be arranged, individually or in groups, for example, on an appropriately large diaphragm, and form the diaphragm units.

Additionally or alternatively, it is advantageous when the diaphragm is cut in the region between two diaphragm units. As a result, the diaphragm units, including one or multiple transducer units, can be isolated.

It is advantageous when at least one recess is formed in the at least one electrode layer, piezoelectric layer, and/or carrier layer, so that an electrical connection to the at least one electrode layer can be formed. The recess can also be designed as a feedthrough, in which an electrical line can be arranged, in order to conduct the electrical signal for generating sound to the piezoelectric layer and/or in order to conduct the generated electrical signal away from the piezoelectric layer during the detection of sound.

It is advantageous when the transducer unit and/or the diaphragm unit are/is provided with at least one electrically conductive conductor for the electrical connection to the at least one electrode layer. The conductor can be designed as a conducting layer, which is imprinted with the aid of a printing process, a deposition process, and/or a coating process.

The invention further relates to a diaphragm unit comprising a diaphragm and at least one transducer unit connected thereto, which comprises at least one electrode layer and at least one piezoelectric layer. With the aid of the piezoelectric layer, an electrical signal, which can include, for example, an audio signal, can be converted into a deflection. This deflection can be transmitted onto the diaphragm, in order, for example, to generate, in particular audible, sound. The diaphragm unit can therefore be operated as a loudspeaker. Additionally or alternatively, a sound can also excite the diaphragm to vibrate, which results in a deflection of the diaphragm. This deflection can be transmitted onto the piezoelectric layer, which, moreover, generates an electrical signal. The electrical signal can contain an audio signal, so that the diaphragm unit can be operated as a microphone.

The diaphragm unit can be designed according to at least one method feature of the preceding description and/or the following description.

Moreover, the transducer units can be arranged on the diaphragm in nearly arbitrary shapes, geometries, and/or arrangements. For example, the three transducer units can be arranged in a triangle on the diaphragm, so that the diaphragm unit comprises three transducer units, which are arranged in a triangle.

BRIEF DESCRIPTION OF THE DRAWINGS

Aspects and advantages of the invention are set forth below in the following description, or may be obvious from the description, or may be learned through practice of embodiments of the invention. Those of ordinary skill in the art will better appreciate the features and aspects of such embodiments, and others, upon review of the specification. A full and enabling disclosure of the present invention, including the best mode thereof to one skilled in the art, is set forth more particularly in this specification, including reference to the accompanying figures, in which:

FIG. 7 shows a schematic top view of multiple diaphragm units.

FIG. 9 shows a schematic top view of multiple diaphragm units, each with a single electrode.

DETAILED DESCRIPTION OF EXEMPLARY EMBODIMENTS

Figure 1:
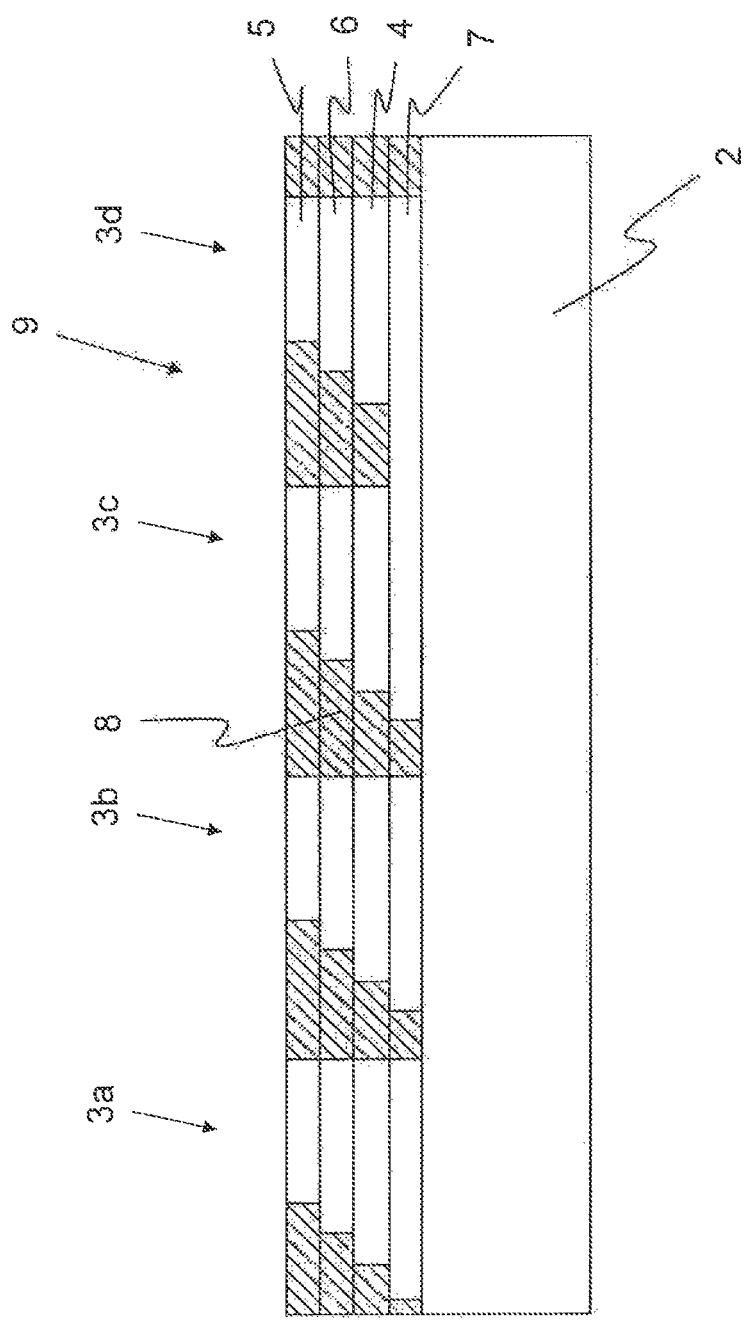
FIG. 1 shows a schematic side view of multiple transducer units formed in layers.

Reference will now be made in detail to present exemplary embodiments of the invention, wherein one or more examples of which are illustrated in the accompanying drawings. The detailed description uses numerical designations to refer to features in the drawings. Like or similar designations in the drawings and description have been used to refer to like or similar parts of the embodiments of the invention. With respect to the figures, it is to be noted that these are schematic views. The magnitudes and size ratios do not need to match reality. In addition, only the manufacturing process, including the individual steps, is explained with reference to the figures. The mutual arrangement of the various features does not need to match reality, although it can. Each example is provided by way of explanation of the invention, not limitation of the invention. In fact, it will be apparent to those skilled in the art that modifications and variations can be made in the present invention without departing from the scope or spirit thereof. For instance, features illustrated or described as part of one embodiment may be used on another embodiment to yield a still further embodiment. Thus, it is intended that the present invention covers such modifications and variations as come within the scope of the appended claims and their equivalents.

Figure 2:
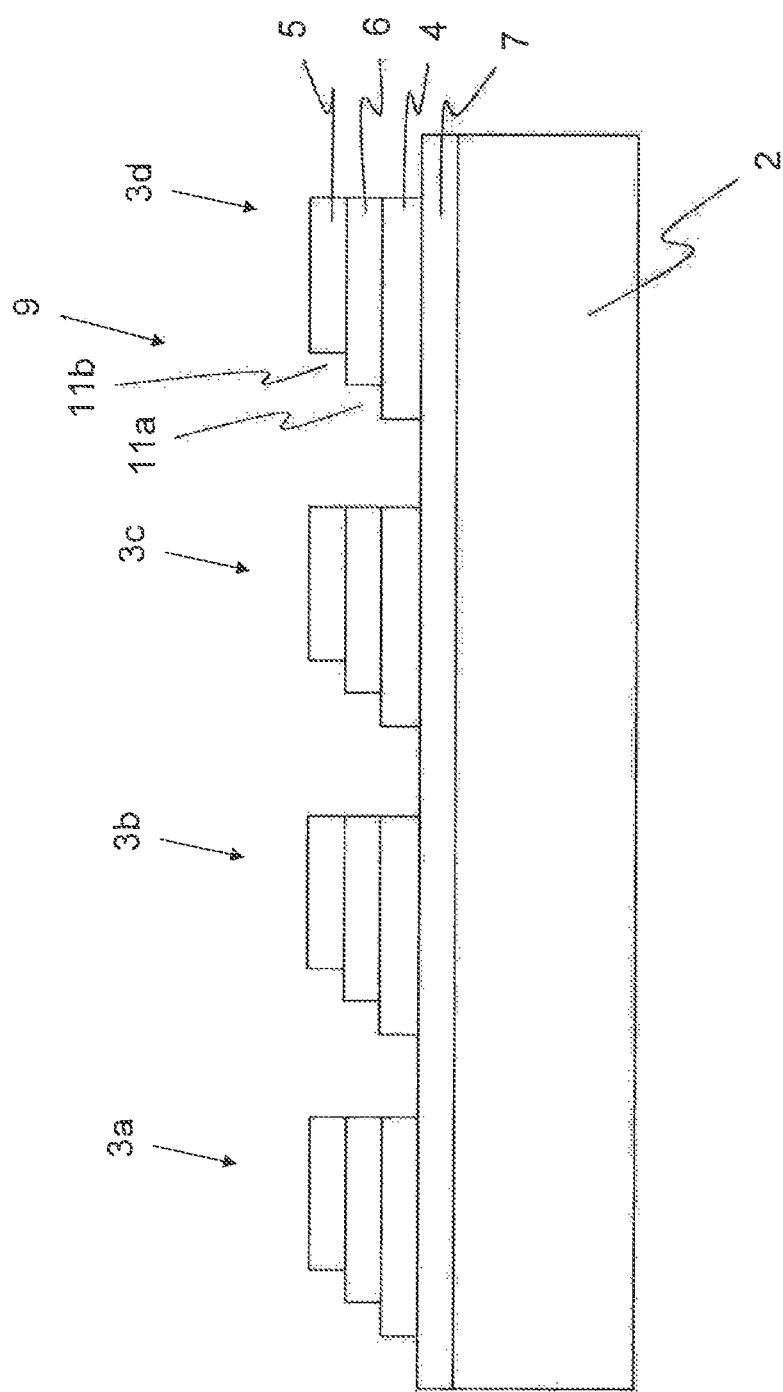
FIG. 2 shows a schematic side view of multiple transducer units formed separately from one another.
Figure 3:
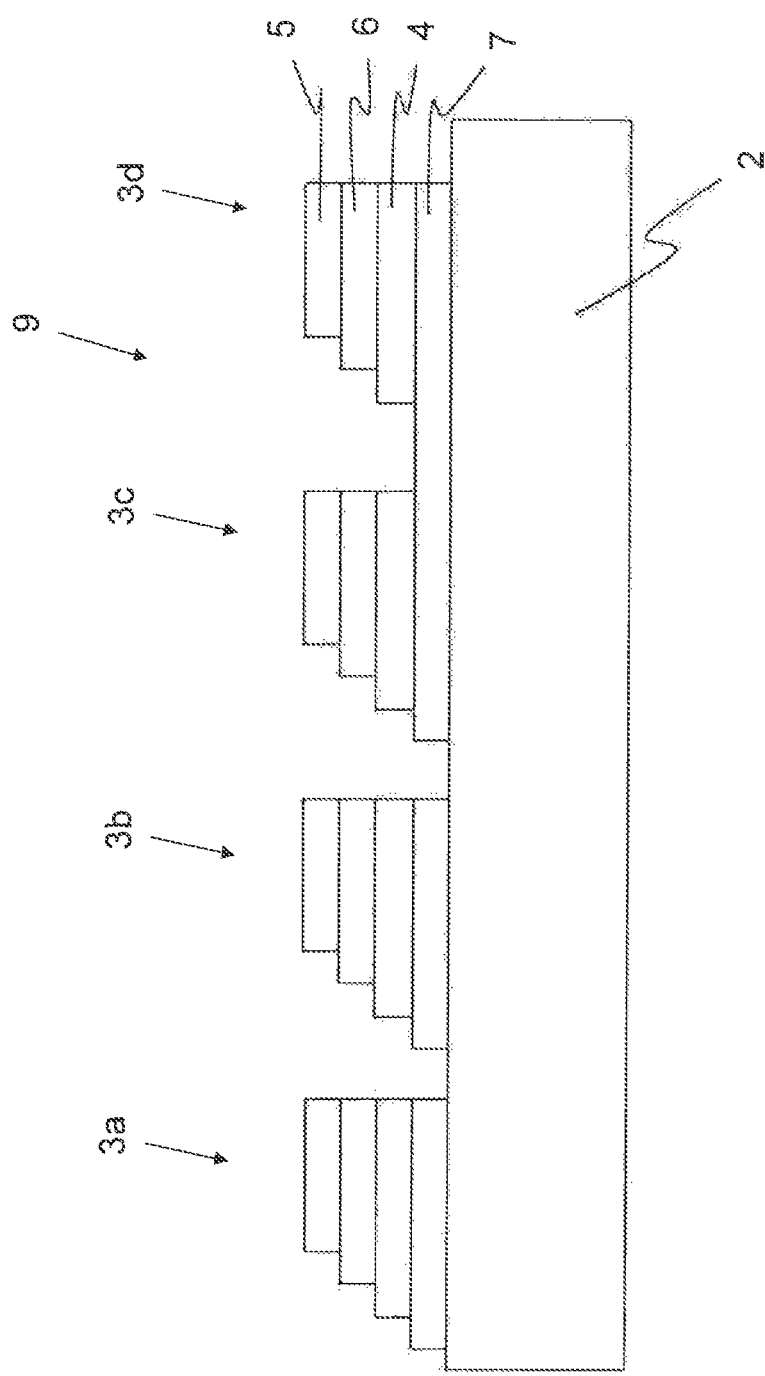
FIG. 3 shows a schematic side view of multiple transducer units.

FIG. 1 shows a schematic side view of several multi-layer piezoelectric transducer units 3a-3d. In the present exemplary embodiment, four transducer units 3a-3d are shown, wherein FIG. 1 can merely be a section. Since FIG. 1 depicts a cross sectional view, the area depicted in the cross-section shown in FIG. 1 stands for a three dimensional region that includes a width dimension and a depth dimension visible in FIG. 1 as well as a length dimension that would run into an out of the planar surface shown in FIG. 1. Thus, while each of the several multi-layer piezoelectric transducer units 3a-3d occupies three spatial dimensions, only two of the dimension are depicted in FIGS. 1-5 and 7 for the sake of simplicity. FIG. 6 presents a schematic representation of a perspective view from above multiple transducer units 3a-3f mounted on a diaphragm 10. As shown in FIGS. 1-3, the transducer units 3a-3d are arranged on a carrier 2. Up to 1000 or more transducer units 3a-3d can be formed on the carrier 2 for mass production. The transducer units 3a-3d, together with a diaphragm 10, form diaphragm units 1 (cf. FIGS. 5, 6 and 7), which can be utilized for MEMS transducers.

In the process of manufacturing the transducer units 3a-3d schematically shown in FIGS. 1-3, at least one electrode layer 4, 5 and at least one piezoelectric layer 6 are formed on the carrier 2. Each of the transducer units 3a-3d therefore includes at least one electrode layer 4, 5 and at least one piezoelectric layer 6. According to the present exemplary embodiment schematically shown in FIGS. 1-3, the at least one electrode layer 4, 5 and the at least one piezoelectric layer 6 are formed over the entire surface of the carrier 2. The shaded and cross-hatched areas of the at least one electrode layer 4, 5 and the at least one piezoelectric layer 6 shown in FIG. 1 can be removed in a method step, so that each of the transducer units 3a-3d is separated from each other one of the transducer units 3a-3d. In other words, the transducer units 3a-3d are separated from one another. The shaded and cross-hatched area schematically represented in FIG. 1 can represent, for example, an etching region 8. The etching region 8 can be removed, for example, with the aid of an etching process, of the type utilized in semiconductor technology. The individually separated transducer units 3a-3d are shown, for example, in FIG. 3 after completion of a removal step such as etching applied to the embodiment depicted in FIG. 1.

With the aid of the piezoelectric layer 6, an electrical signal, which can embody, for example, an audio signal, can be converted into a deflection. If the piezoelectric layer 6 is acted upon by the electrical signal, the piezoelectric layer 6 itself deflects. This deflection can be converted into sound, which can encompass tones, music, and/or speech corresponding to the audio signal. The transducer units 3a-3d can therefore be utilized for designing a loudspeaker.

Additionally or alternatively, a deflection can also be converted into an electrical signal with the aid of the piezoelectric layer 6. If sound impacts a transducer unit 3a-3d, the piezoelectric layer 6 itself can be deflected. The piezoelectric layer 6 converts this deflection into an electrical signal, which contains information regarding the sound. The transducer units 3a-3d can therefore be utilized for designing a microphone. The transducer units 3a-3d can therefore be arranged, for example, in a smartphone or in a similar device.

Additionally or alternatively, the transducer units 3a-3d can also be utilized for mechanical systems. The transducer units 3a-3d can be utilized, for example, in micropumps, since a fluid can be also be pumped with the aid of the deflection of the piezoelectric layer 6.

The piezoelectric layer 6 is made of a piezoelectric material, which has the piezoelectric effect.

With the aid of the at least one electrode layer 4, 5, the electrical signal can be conducted to the piezoelectric layer 6, in order to deflect the piezoelectric layer 6. Additionally or alternatively, the electrical signal can also be conducted away with the aid of the at least one electrode layer 4, 5 if the piezoelectric layer 6 itself is deflected and generates the electrical signal. The at least one electrode layer 4, 5 is advantageously made of an electrically conductive material.

According to the present exemplary embodiment, each of the transducer units 3a-3d desirably comprises a first electrode layer 4 and a second electrode layer 5. As a result, a circuit can be closed. In the present exemplary embodiment, the piezoelectric layer 6 is arranged between the two electrode layers 4, 5.

According to the present exemplary embodiment, a carrier layer 7 is formed on the carrier 2 during the manufacturing process. The carrier layer 7 can be designed as an epitaxial layer. The carrier layer 7 can act as a sacrificial layer, which is removed during the removal of the carrier 2 from the transducer units 3a-3d. The carrier 2 can be more easily separated from the transducer units 3a-3d if the carrier layer 7 is, for example, at least partially, in particular chemically, dissolved and/or removed.

According to the present exemplary embodiment, the carrier layer 7 is only partially removed, according to the shaded areas in FIG. 1. According to the present exemplary embodiment, the carrier layer 7 forms a part of each of the transducer units 3a-3d. As a result, the carrier layer 7 can act, for example, as a counterpart for the piezoelectric layer 6. The carrier layer 7 can have a greater rigidity than the piezoelectric layer 6, so that the piezoelectric layer 6 can deflect with respect to the carrier layer 7.

According to the present exemplary embodiment, the carrier layer 7, the at least one electrode layer 4, 5, and/or the piezoelectric layer 6 are arranged one above the other. First of all, the carrier layer 7 is formed on the carrier 2. The first electrode layer 4 is formed on the carrier layer 7. The piezoelectric layer 6 is formed on the first electrode layer 4. The second electrode layer 5 is formed on the piezoelectric layer 6. Alternatively, the at least one electrode layer 4, 5 can be formed on the carrier 2.

The regions indicated by shaded areas in FIG. 1 can be removed, for example, with the aid of an etching process. As a result, the transducer units 3a-3d are separated from one another. According to the present exemplary embodiment schematically shown in FIGS. 1 and 3, the carrier layer 7, the at least one electrode layer 4, 5, and the piezoelectric layer 6 are removed from between the two transducer units 3a, 3b and removed from between the two transducer units 3b, 3c. Only the at least one electrode layer 4, 5 and the at least one piezoelectric layer 6 are removed between the two transducer units 3c, 3d, so that the carrier layer 7 remains intact between the two transducer units 3c, 3d. As a result, the two transducer units 3c, 3d are connected to one another with the aid of the carrier layer 7, so that these two transducer units 3c, 3d form a contiguous group 9. By comparison, the two transducer units 3a, 3b form individual transducer units 3a, 3b. In an alternative exemplary embodiment (not shown here), at least one electrode layer 4, 5, preferably the lowermost or the first electrode layer 4, could also remain intact between the two transducer units 3c, 3d. With the aid of this one electrode layer 4, 5, both transducer units 3c, 3d share a common ground or a reference potential.

The electrode layers 4, 5, the piezoelectric layer 6, and the carrier layer 7 are provided only with a single reference character in this case and in the following figures, for the sake of simplicity and clarity. Strictly speaking, the aforementioned layers 4-7 are also separated from one another, corresponding to the separated transducer units 3a-3d. The orientation of the aforementioned layers 4-7 is advantageously always the same in all transducer units 3a-3d, however. In particular, each layer 4-7 extends in a plane, which can be arranged in parallel to the carrier 2, over the carrier 2. Unless described otherwise, the order of the layers 4-7 is always the same.

FIG. 2 shows an alternative process for manufacturing a diaphragm unit 1 comprising multiple transducer units 3a-3d. Features that have already been described with reference to the preceding figure will not be explained once more, however, for the sake of simplicity, if they have the same effect or a similar effect.

Figure 8:
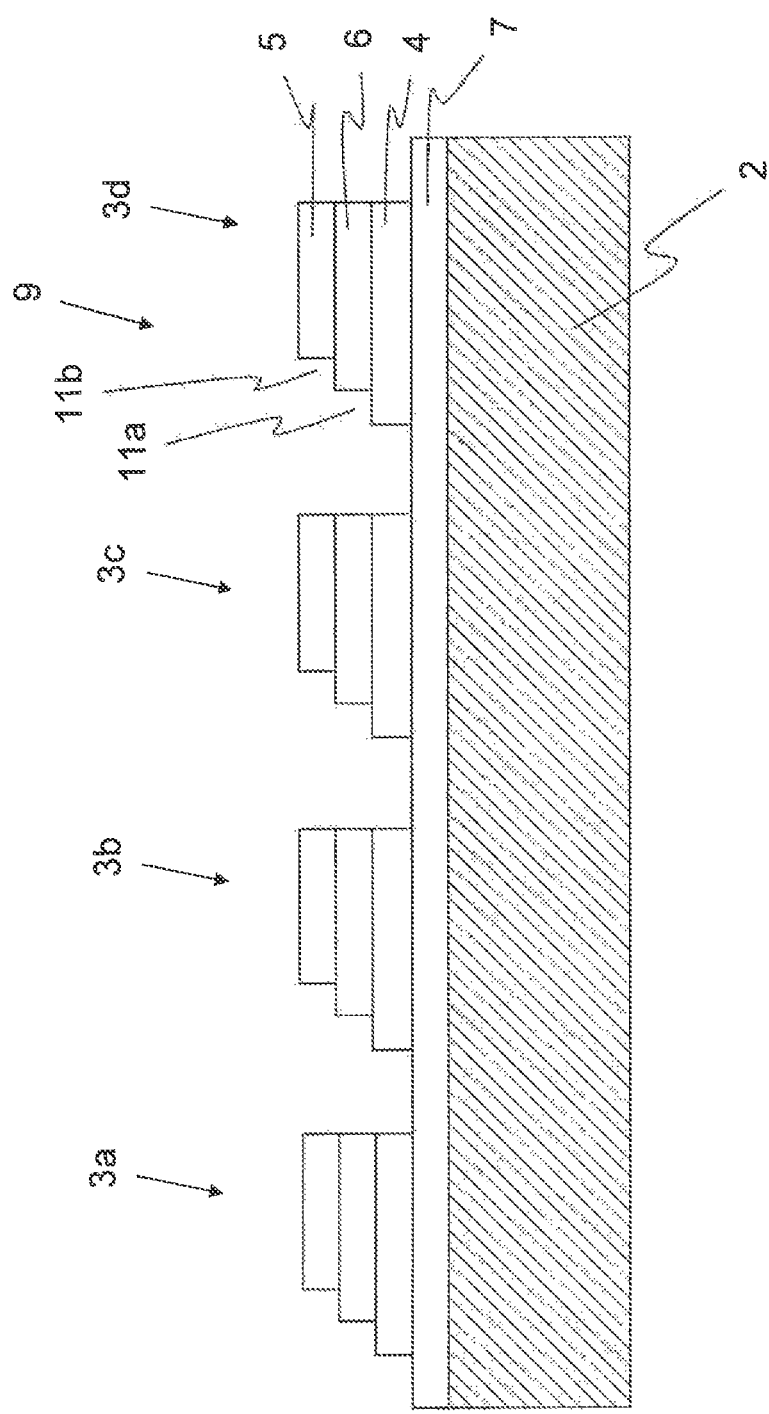
FIG. 8 shows a schematic side view of multiple transducer units formed separately from one another.

According to the present exemplary embodiment schematically shown in each of FIG. 2 and FIG. 8, the transducer units 3a-3d are at least partially separated from one another. The at least one electrode layer 4, 5 and the at least one piezoelectric layer 6 are designed already separated from one another, so that the individual transducer units 3a-3d can be formed. According to the present exemplary embodiment shown in each of FIG. 2 and FIG. 8, only the carrier layer 7 is formed over the entire surface of the carrier 2. In FIG. 8, the carrier can be formed of metal. In order to at least partially separate the transducer units 3a-3d from one another, the carrier layer 7 must be removed between at least some transducer units 3a-3d. The selective formation (shown here) of the at least one electrode layer 4, 5, of the piezoelectric layer 6, and/or of the carrier layer 7 can take place, for example, with the aid of photolithography.

Moreover, according to the present exemplary embodiment shown in FIG. 2, at least one transducer unit 3a-3d comprises at least one recess 11a, 11b. For the sake of simplicity, the at least one recess 11a, 11b is provided with a reference character on only one transducer unit 3d. With the aid of the at least one recess 11a, 11b, for example, an electrical connection to at least one electrode layer 4, 5 can be formed, in order to conduct an electrical signal to or away from this electrode layer 4, 5. According to the present exemplary embodiment, at least the piezoelectric layer 6 defines the first recess 11a, so that the underlying first electrode layer 4 is at least partially exposed. An electrical conductor (not shown here) can be placed into the first recess 11a, which can form a connection to the first electrode layer 4. Additionally or alternatively, the second electrode layer 5 defines the second recess 11b. The recess 11a, 11b can also be designed as a feedthrough, for example, in the at least one electrode layer 4, 5 in the piezoelectric layer 6, and/or in the carrier layer 7, so that an electrical connection to at least one electrode layer 4, 5 can be formed.

FIG. 3 shows a schematic side view of multiple transducer units 3a-3d. Features that have already been described with reference to the preceding figures are not explained once more, for the sake of simplicity.

According to the present exemplary embodiment schematically shown in FIG. 3, the transducer units 3a-3d are at least partially separated from one another. In addition to the at least one electrode layer 4, 5 and the piezoelectric layer 6, the carrier layer 7 is also removed between the transducer unit 3a and the transducer unit 3b as well as between the transducer unit 3b and the transducer unit 3c, whereby the aforementioned transducer units 3a-3c are separated from one another. However, all of the transducer units 3a-3d are still arranged on the carrier 2.

As schematically shown in FIG. 3, the carrier layer 7 is still intact between the transducer unit 3c and the transducer unit 3d, so that these two transducer units 3c, 3d are still connected to each other via the carrier layer 7. The two transducer units 3c, 3d therefore form the contiguous group 9.

Figure 4:
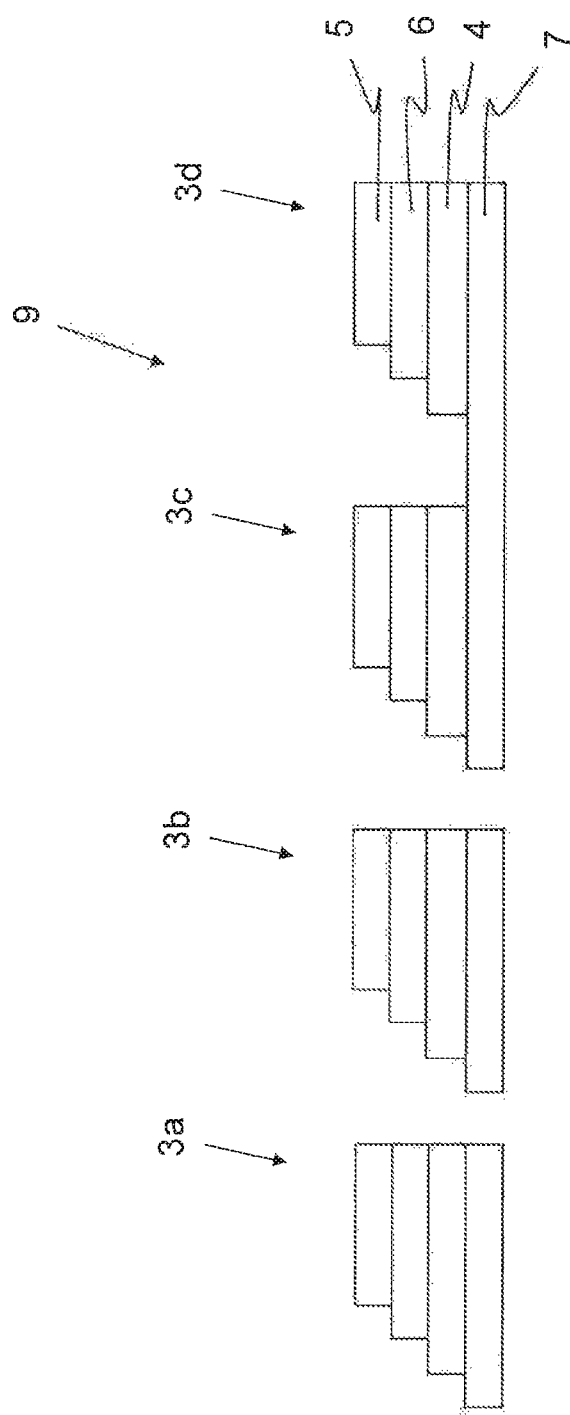
FIG. 4 shows a schematic side view of multiple transducer units, wherein the carrier has been removed.

FIG. 4 shows a schematic side view of multiple transducer units 3a-3d, wherein the carrier 2 has been removed. Features that have already been described with reference to the preceding figures are not explained once more, for the sake of simplicity. The exemplary embodiment shown here comprises two individual transducer units 3a, 3b and a contiguous group 9 made up of two transducer units 3c, 3d.

A contiguous group 9 comprises at least two transducer units 3a-3d. Additionally or alternatively, this or another contiguous group 9 can also comprise more than two transducer units 3a-3d. Furthermore, according to the present exemplary embodiment, the two transducer units 3c, 3d of the contiguous group 9 are arranged merely offset with respect to one another in a translatory manner, as opposed to being disposed one above the other. The two transducer units 3c, 3d have the same orientation with respect to one another, however. In an alternative exemplary embodiment, at least two transducer units 3a-3d can be rotated with respect to one another. For example, at least two transducer units 3a-3d can be oriented opposite each other. Furthermore, according to the present exemplary embodiment, the transducer units 3a-3d are shown arranged one behind the other. Additionally or alternatively, the transducer units 3a-3d can also be arranged on the carrier 2 in a planar manner, so that the transducer units 3a-3d are also arranged next to one another, in addition to one behind the other. The transducer units 3a-3d also can be arranged only next to one another.

Furthermore, the carrier 2 has been removed from the transducer units 3a-3d. For example, this can be achieved in that a connection between the carrier 2 and the first layer, which is or was the carrier layer 7 in this case, is released. This can be carried out, for example, with the aid of a chemical process. For example, according to the present exemplary embodiment, the carrier layer 7 can be at least partially chemically dissolved. In this case, the carrier layer 7 can therefore be designed to be thicker, so that the carrier layer 7 is still present after the partial dissolution. The release of the connection between the carrier 2 and the first layer, which is the carrier layer 7 in this case, can be advantageous if the carrier 2 is expensive and is to be reused. The carrier 2 can be, for example, a silicon wafer, which is relatively expensive to acquire and is to be reused.

Additionally or alternatively, the carrier 2 can also be ground off until the transducer units 3a-3d remain as shown in FIG. 4 for example. This can be advantageous for the case in which the carrier 2 would be destroyed anyway and/or in which the carrier 2 has been made of a low-cost material.

Figure 5:
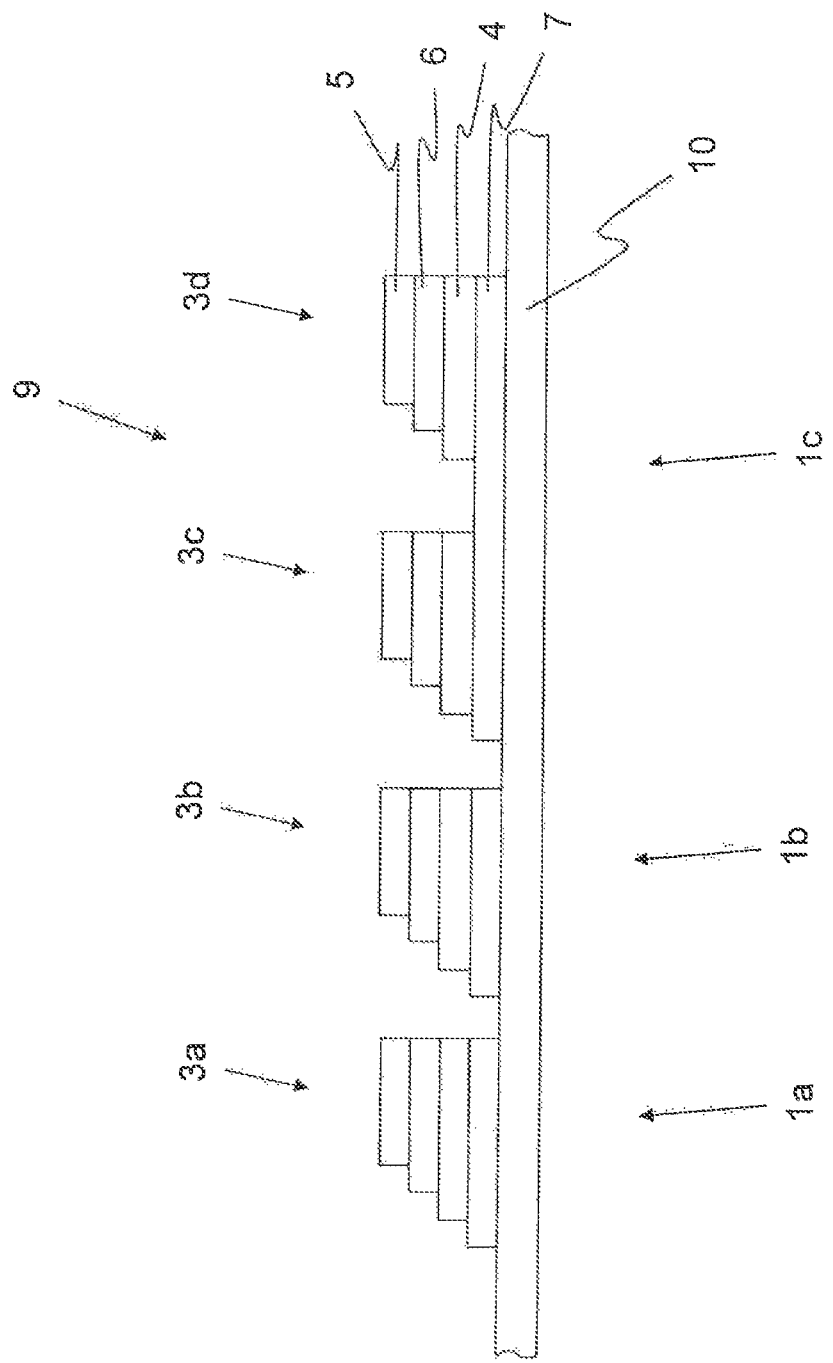
FIG. 5 shows a schematic side view of multiple transducer units on a diaphragm.
Figure 6:
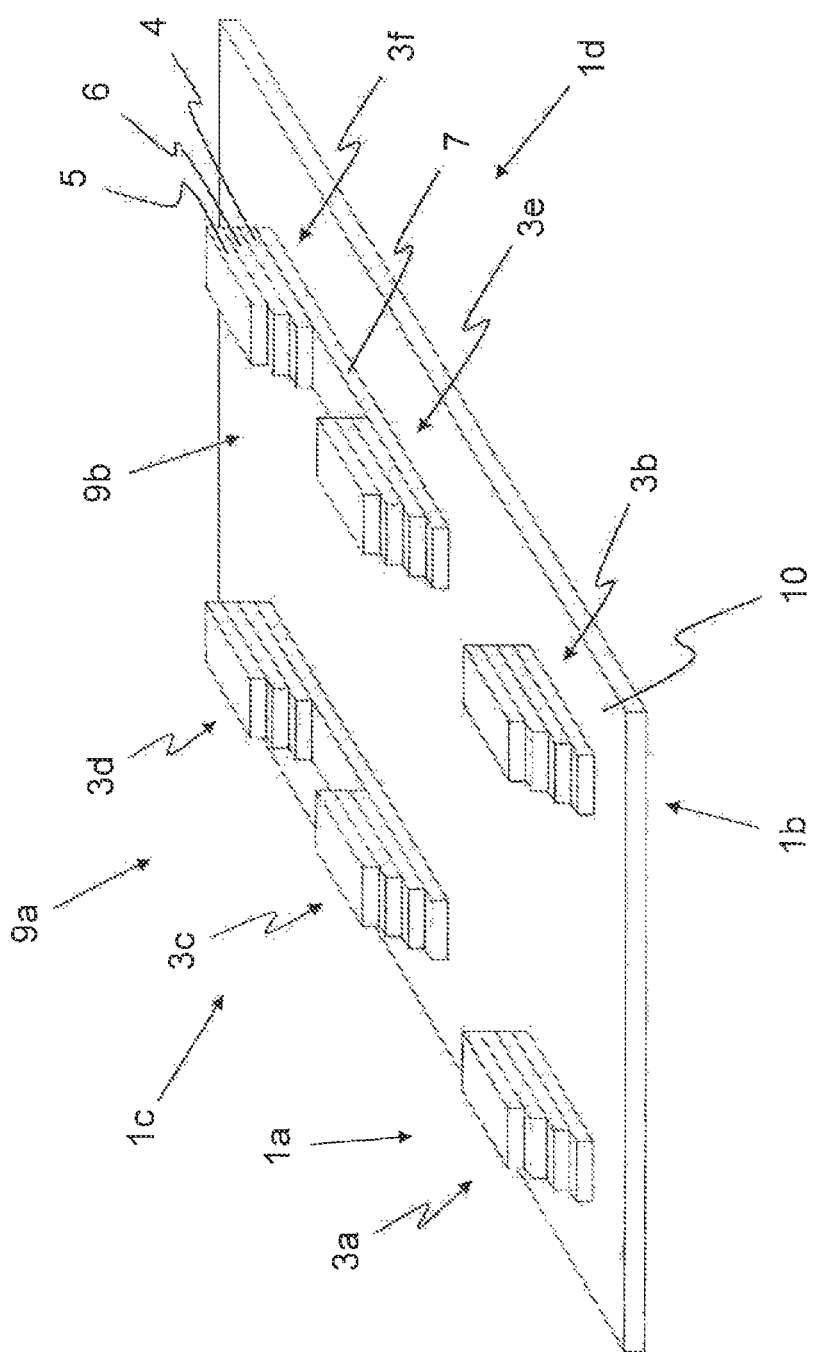
FIG. 6 shows a schematically shows a perspective view from above multiple transducer units on a diaphragm.

FIG. 5 shows multiple transducer units 3a-3d mounted on a diaphragm 10. For the sake of simplicity, features that already have been described with reference to the preceding figures are not explained again. The diaphragm 10 can be a polymer layer. The diaphragm 10 can be made, for example, of a flexible material, such as polyp-xylylene) or Parylene. A thickness of the diaphragm 10 can be in the range of a few micrometers, for example, 5 µm-7 µm. The thickness of the diaphragm 10 is at least 0.01 µm. The transducer units 3a-3d, together with the diaphragm 10 according to the present exemplary embodiment schematically shown in FIG. 5, form three diaphragm units 1a-1c. The first transducer unit 3a forms a diaphragm unit 1a, and the second transducer unit 3b forms a diaphragm unit 1b, respectively. The two other transducer units 3c, 3d, together, form the contiguous group 9. The contiguous group 9 comprising the two transducer units 3c, 3d forms a single diaphragm unit 1c. This diaphragm unit 1c therefore comprises a diaphragm 10 including two transducer units 3c, 3d combined to form the contiguous group 9. With the aid of the two transducer units 3c, 3d, the diaphragm 10 can be, for example, deflected to a greater extent, so that a sound pressure can be increased if the diaphragm unit 1c is utilized for generating sound.

According to the present exemplary embodiment schematically shown in FIG. 5, the diaphragm units 1a-1c are still connected to one another with the aid of the diaphragm 10. In a subsequent step, the diaphragm 10 can be separated between the diaphragm units 1a-1c, in order to isolate the diaphragm units 1a-1c.

Before the transducer units 3a-3d are placed onto the diaphragm 10, the transducer units 3a-3d can be reinforced with the aid of reinforcing agents. Silsesquioxanes, for example, which improve the temperature resistance of the diaphragm 10, can be utilized as reinforcing agents. As a result, the diaphragm units 1a-1c can be soldered when being incorporated into other useful devices.

The diaphragm 10 also can be a partially cured diaphragm, so that the connection between the transducer units 3a-3d and the diaphragm 10 can be formed during the placement of the transducer units 3a-3d on the diaphragm 10. The partially cured diaphragm can be cured, for example, by supplying heat, so that integrally joined connections are formed between the transducer units 3a-3d and the diaphragm 10.

FIG. 6 shows a schematic, perspective view of multiple transducer units 3a-3d on a diaphragm 10. For the sake of simplicity, redundant explanation of features that already have been described with reference to the preceding figures are omitted. In the present exemplary embodiment, six transducer units 3a-3f are arranged on the diaphragm 10. These are two individual transducer units 3a, 3b and two contiguous groups 9a, 9b. Each of the contiguous groups 9a, 9b respectively includes two transducer units 3c, 3d and 3e, 3f. In the present exemplary embodiment schematically shown in FIG. 6, the transducer units 3c, 3d and 3e, 3f in each of the two contiguous groups 9a, 9b are connected to one another with the aid of the carrier layer 7.

Due to the removal of the carrier 2 from the transducer units 3a-3f and the at least partial isolation of the transducer units 3a-3f, a free placement of the transducer units 3a-3f on the diaphragm 10 is ensured. The transducer units 3a-3f can be arranged on the diaphragm 10 in a nearly arbitrary arrangement and grouping. For example, as schematically shown in FIG. 6, the transducer unit 3a forms, together with the diaphragm 10, the first diaphragm unit 1a. This first diaphragm unit 1a encompasses only one transducer unit 3a. The same configuration applies to the second diaphragm unit 1b, which also includes only one transducer unit 3b. The third diaphragm unit 1c includes the diaphragm 10 and two transducer units 3c, 3d, which are combined to form the contiguous group 9a. With the aid of the two transducer units 3c, 3d, for example, sound can be generated having a greater sound pressure than is the case using only one transducer unit 3a-3f. The fourth diaphragm unit 1d comprises the diaphragm 10 and the two transducer units 3e, 3f, which are combined to form the contiguous group 9b.

No limits are placed on the configuration of the diaphragm units 1. For example, the transducer units 3a-3f can be arranged on the diaphragm 10 in a nearly arbitrary pattern of placements with respect to one another. For example, three of the transducer units 3a-3f can be arranged on the diaphragm 10 in a triangular pattern with one of the transducer units 3a-3f at each vertex of the triangle, wherein the three transducer units 3a-3f and the diaphragm 10 form a diaphragm unit 1. After the transducer units 3a-3f have been arranged in accordance with the grouping to form the diaphragm unit 1, the diaphragm 10 is cut, so that the individual diaphragm units 1 are formed.

In order to form the individual diaphragm units 1a-1d, the diaphragm 10 is cut, for example, sliced, in accordance with the grouping of the transducer units 3a-3f to form the diaphragm units 1a-1d.

Each of FIG. 7 and FIG. 9 shows a schematic top view of multiple diaphragm units 1a-1c. For the sake of simplicity, features that already have been described with reference to the preceding figures are not repeated. According to each present exemplary embodiment, the diaphragm 10 is cut at least partially between the transducer units 3a-3f and/or at least partially between the contiguous groups 9a, 9b.

In the present exemplary embodiment schematically shown in FIG. 7, the diaphragm 10 is cut between the two transducer units 3a, 3b and with respect to the four other transducer units 3c-3f. The two transducer units 3a, 3b each form, together with a section of the diaphragm 10, a diaphragm unit 1a, 1b, respectively.

The four transducer units 3c-3f form a diaphragm unit 1c, wherein two transducer units 3c, 3d and 3e, 3f are combined to form the two contiguous groups 9a, 9b, respectively. Two transducer units 3c-3f are arranged one behind the other in each case and two transducer units 3c-3f are arranged next to one another in each case. The transducer units 3c-3f of the diaphragm unit 1c are therefore arranged according to a rectangle with a respective one of the four transducer units 3c-3f disposed toward a respective one of the four corners of the rectangle.

The diaphragm 10 can be divided in order to form the individual diaphragm units 1a-1c. The diaphragm 10 can be, for example, sliced, depending on which and how many transducer units 3a-3f belong to a diaphragm unit 1a-1c.

If, additionally, the diaphragm 10 of the diaphragm unit 1c would be cut between the two contiguous groups 9a, 9b, two diaphragm units 1 would be formed, similarly to FIG. 6.

Moreover, as schematically shown in each of FIG. 7 and FIG. 9, the transducer units 3a-3f also include at least one conductor 12, 13. The at least one conductor 12, 13 can be designed, for example, as a conducting layer, which is imprinted, for example, onto the transducer units 3a-3f and/or onto the diaphragm units 1a-1c. According to the present exemplary embodiment schematically shown in FIG. 9, the transducer units 3a-3f include a first conductor 12. According to the present exemplary embodiment schematically shown in FIG. 7, the transducer units 3a-3f include a first conductor 12 and a second conductor 13. The first conductor 12 is connected to the first electrode layer 4, and the second conductor 13 is connected to the second electrode layer 5. With the aid of the at least one electrical conductor 12, 13, the electrical connection to the at least one electrode layer 4, 5, respectively, can be formed. In this case, the at least one conductor is once again provided with a reference character on only one transducer unit 3f in each of FIG. 7 and FIG. 9. The other transducer units 3a-3e also can include at least one conductor 12, 13, as is schematically shown in each of FIG. 7 and FIG. 9 for transducer unit 3f.

If a diaphragm unit 1c comprises multiple transducer units 3c-3f, the at least one conductor 12, 13 of the particular transducer units 3c-3f, also can be connected to one another, so that the electrical signal is conducted to and/or is conducted away from all transducer units 3c-3f. As a result of such a configuration, the transducer units 3c-3f of the diaphragm unit 1c are electrically connected to one another.

Additionally or alternatively, the at least one electrical conductor 12, 13 also can be arranged in and/or on the diaphragm 10. The electrical connection between the at least one electrical conductor 12, 13 and the at least one electrode layer 4, 5 is formed when the transducer units 3a-3f are placed onto the diaphragm 10.

The present invention is not limited to the represented and described exemplary embodiments. Modifications within the scope of the claims are also possible, as is any combination of the features, even if they are represented and described in different exemplary embodiments.

LIST OF REFERENCE CHARACTERS 1 diaphragm unit
2 carrier
3 transducer unit
4 first electrode layer
5 second electrode layer
6 piezoelectric layer
7 carrier layer
8 etching region
9 contiguous group
10 diaphragm
11 recess
12 first conductor
13 second conductor

What is claimed is:

1. A process for manufacturing a diaphragm unit of a MEMS transducer that includes at least one piezoelectric transducer unit, each piezoelectric transducer unit including at least one electrode layer and at least one piezoelectric layer formed one above the other, the process comprising the following steps:
forming each piezoelectric transducer unit by placing at least one electrode layer and at least one piezoelectric layer above a carrier;
removing at least one piezoelectric transducer unit from above the carrier;
arranging on a partially cured diaphragm each piezoelectric transducer unit that has been removed from above the carrier; and
fully curing the partially cured diaphragm to effect connecting to the fully cured diaphragm each piezoelectric transducer unit that has been removed from above the carrier to form the diaphragm unit.

2. The manufacturing process as in claim 1, wherein before the step of removing at least one piezoelectric transducer unit from above the carrier, each piezoelectric transducer unit is separated from each other piezoelectric transducer unit.

3. The manufacturing process as in claim 1, wherein after the step of removing at least one piezoelectric transducer unit from above the carrier, each piezoelectric transducer unit is separated from each other piezoelectric transducer unit.

4. The manufacturing process as in claim 1, wherein each piezoelectric transducer unit is designed separated from each other piezoelectric transducer unit and/or are separated from one another in such a way that at least one isolated piezoelectric transducer unit and/or at least one contiguous group of at least two piezoelectric transducer units are/is formed.

5. The manufacturing process as in claim 1, further comprising the step of before the step of placing at least one electrode layer and at least one piezoelectric layer above a carrier, forming a carrier layer on the carrier and placing each electrode layer on the carrier layer and placing each piezoelectric layer on each electrode layer to form multiple piezoelectric transducer units on the carrier.

6. The manufacturing process as in claim 5, further comprising the step of using each of the multiple piezoelectric transducer units to form at least one of multiple diaphragm units.

7. The manufacturing process as in claim 6, further comprising the step of separating the diaphragm to form the multiple diaphragm units.

8. The manufacturing process as in claim 5, further comprising the step of disconnecting the carrier from the carrier layer by dissolving the carrier layer or by grinding the carrier off the carrier layer.

9. The manufacturing process as in claim 5, further comprising the steps of:
forming the at least one electrode layer as a first electrode layer formed on the carver;
forming the at least one piezoelectric layer as a first piezoelectric layer formed on the first electrode layer; and
forming a second electrode layer on the first piezoelectric layer.

10. The manufacturing process as in claim 9, further comprising the step of connecting at least one electrically conductive conductor to at least one of the first electrode layer and the second electrode layer by using one of: a printing process, a deposition process, and/or a coating process to imprint the at least one electrically conductive conductor on at least one of the first electrode layer and the second electrode layer.

11. The manufacturing process as in claim 9, further comprising the following steps:
removing a first section of the second electrode layer down to the first piezoelectric layer;
removing a first section of the first piezoelectric layer down to the first electrode layer; and
removing a first section of the first electrode layer and forming a first piezoelectric transducer unit spaced apart from a second piezoelectric transducer unit on the carrier layer.

12. The manufacturing process as in claim 11, further comprising the step of forming a recess during the step of removing a first section of the second electrode layer down to the first piezoelectric layer and/or during the step of removing a first section of the first piezoelectric layer down to the first electrode layer and/or during the step of forming a second electrode layer on the first piezoelectric layer, wherein provision is made for an electrical connection to at least one of the first electrode layer and the second electrode layer.

13. The manufacturing process as in claim 11, wherein etching and/or cutting removes at least one of the first section of the first electrode layer, the first section of the first piezoelectric layer, and the first section of the second electrode layer.

14. The manufacturing process as in claim 11, wherein the step of removing the first section of the first electrode layer proceeds down to the carrier layer.

15. The manufacturing process as in claim 11, further comprising the step of removing the first piezoelectric transducer unit from the carrier layer.

16. The manufacturing process as in claim 11, further comprising the step of removing the second piezoelectric transducer unit from the carrier layer.

17. The manufacturing process as in claim 11, further comprising the step of arranging the second piezoelectric transducer unit on the diaphragm spaced apart from the first piezoelectric transducer unit.

18. The manufacturing process as in claim 17, further comprising the steps of connecting the diaphragm to the second piezoelectric transducer unit and the first piezoelectric transducer unit, and forming a first diaphragm unit and a second diaphragm unit by cutting the diaphragm between where the first piezoelectric transducer unit is connected to the diaphragm and where the second piezoelectric transducer unit is connected to the diaphragm.

19. A diaphragm unit, comprising:
a diaphragm;
a transducer unit connected to the diaphragm and including a first electrode layer, a second electrode layer and a piezoelectric layer disposed between the first electrode layer and the second electrode layer;
wherein the diaphragm unit is designed according to a process comprising the following steps:
removing the piezoelectric transducer unit from a carrier;
arranging on a partially cured diaphragm, the piezoelectric transducer units that has been removed from the carrier on a diaphragm; and
fully curing the partially cured diaphragm to connect the piezoelectric transducer unit that has been removed from the carrier to the diaphragm to form the diaphragm unit.

* * * * *